US008106397B2

(12) United States Patent
Kwon et al.

(10) Patent No.: US 8,106,397 B2
(45) Date of Patent: Jan. 31, 2012

(54) THIN FILM TRANSISTOR FORMED ON FLEXIBLE SUBSTRATE AND METHOD OF MANUFACTURING THE SAME

(75) Inventors: Jang-yeon Kwon, Yongin-si (KR); Sang-yoon Lee, Yongin-si (KR); Jong-man Kim, Yongin-si (KR); Kyung-bae Park, Yongin-si (KR); Ji-sim Jung, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 207 days.

(21) Appl. No.: 11/756,766

(22) Filed: Jun. 1, 2007

(65) Prior Publication Data

US 2007/0278495 A1 Dec. 6, 2007

(30) Foreign Application Priority Data

Jun. 2, 2006 (KR) ........................ 10-2006-0049993

(51) Int. Cl.
*H01L 27/14* (2006.01)
*H01L 29/04* (2006.01)
*H01L 29/15* (2006.01)
*H01L 31/036* (2006.01)

(52) U.S. Cl. ..................... 257/57; 257/72; 257/E21.094

(58) Field of Classification Search .................... 257/57, 257/72, 75; 438/149
See application file for complete search history.

(56) References Cited

U.S. PATENT DOCUMENTS

2002/0009833 A1* 1/2002 Lin et al. ........................ 438/142
2007/0243670 A1* 10/2007 Chen et al. .................... 438/149
2007/0262311 A1* 11/2007 Liu et al. ......................... 257/66

* cited by examiner

*Primary Examiner* — Phat Cao
*Assistant Examiner* — Nga Doan
(74) *Attorney, Agent, or Firm* — Cantor Colburn LLP

(57) ABSTRACT

A thin film transistor ("TFT") includes a poly silicon layer formed on a flexible substrate and including a source region, a drain region, and a channel region, and a gate stack formed on the channel region of the poly silicon layer, wherein the gate stack includes first and second gate stacks, and a region of the poly silicon layer between the first and second gate stacks is an off-set region. A method of manufacturing the TFT is also provided.

8 Claims, 5 Drawing Sheets

70 S1 S2 72 48 46 48 46 64 66 58 62 44 52 56a 56b 54 56 40

THIN FILM TRANSISTOR FORMED ON FLEXIBLE SUBSTRATE AND METHOD OF MANUFACTURING THE SAME

This application claims priority to Korean Patent Application No. 10-2006-0049993, filed on Jun. 2, 2006, and all the benefits accruing therefrom under 35 U.S.C. §119, the contents of which in its entirety are herein incorporated by reference.

BACKGROUND OF THE INVENTION

1. Field of the Invention

The present invention relates to a thin film transistor ("TFT") formed on a flexible substrate and a method of manufacturing the same, and more particularly, to a TFT formed on a flexible substrate having uniform characteristics and a method of manufacturing the same.

2. Description of the Related Art

Cathode ray tube ("CRT") displays are rapidly replaced by flat panel displays in the present display markets. Leading flat panel displays include liquid crystal displays ("LCDs") and plasma display panels ("PDPs"). In flat panel displays, thin film transistors ("TFTs") are usually used as switching devices.

As techniques that can form TFTs at a low temperature are introduced, the TFTs are formed on a flexible substrate such as transparent plastic or glass. As the flexible substrate is used, the flat panel displays can be modified to various forms and the application field thereof can be widened. However, problems occur in the process of forming the TFT on the flexible substrate. For example, according to the location in the flexible substrate where the TFT is formed, the characteristics of the TFT vary.

The variation of characteristics of a TFT according to the location will now be described through a process of forming the TFT on a flexible substrate.

FIG. 1 is a cross-sectional view illustrating a conventional TFT of the prior art formed on a mask aligning reference position of a flexible substrate.

Referring to FIG. 1, a poly silicon film 12 is formed on a flexible glass substrate 10. The poly silicon film 12 is divided into several regions. That is, the poly silicon film 12 includes separated first and second N+ or P+ dopant regions 14 and 16, a channel region 18, and first and second off-set regions, or lightly doped drain ("LDD") regions, a1 and a2. The channel region 18 is located between the first and second N+ or P+ dopant regions 14 and 16, and is separated from the first and second N+ or P+ dopant regions 14 and 16 by the first and second off-set regions a1 and a2, respectively. The first and second off-set regions a1 and a2 are not doped with a conductive dopant. The first off-set region a1 is located between the first N+ or P+ dopant region 14 and the channel region 18, and the second off-set region a2 is located between the second N+ or P+ dopant region 16 and the channel region 18. A gate oxide film 20 is formed on the channel region 18 of the poly silicon film 12. A gate electrode 22 is formed on the gate oxide film 20. The gate oxide film 20 is a silicon dioxide $SiO_2$ film, and the gate electrode 22 is a metal electrode formed of aluminum neodymium AlNd etc.

As described above, the conventional TFT formed on a mask aligning reference position of a flexible substrate includes the first and second off-set regions (or LDD) a1 and a2 which are symmetrical with respect to the channel region 18. Therefore, the conventional TFT that has off-set regions as depicted in FIG. 1 has a smaller leakage current than a conventional TFT that does not have the off-set regions. However, the conventional TFT has the following drawbacks. That is, in the TFT formed on a mask aligning reference position as depicted in FIG. 1, the first and second off-set regions (or LDD) a1 and a2 are symmetrical with respect to the channel region 18, but in the TFT formed on a location separated from the mask aligning reference position as depicted in FIG. 2, the first and second off-set regions (or LDD) a1 and a2 are asymmetrical with respect to the channel region 18 and one of the two off-set regions, in the illustrated case the first off-set region a1, is almost not present. This is because an aligning error of the TFT formed on a location separated from the mask aligning reference position exceeds an error tolerance in aligning a mask used for forming the gate electrode due to thermal expansion of the flexible glass substrate 10 during various processes prior to forming the gate electrode 22. As the TFT depicted in FIG. 2, if the first off-set region a1 is almost not present and the second off-set region a2 is relatively wide, the possibility of causing a leakage current between the first N+ or P+ dopant region 14 and the gate electrode 22 increases.

In the case of the conventional TFT formed on a flexible substrate as described above, there is almost no leakage current problem when the conventional TFT is formed on the mask aligning reference position, but the conventional TFT formed on a location separated from the mask aligning reference position is not free from the leakage current problem. Therefore, the conventional TFT formed on a flexible substrate can have different operation characteristics according to the forming location of the TFT even at the same operation condition.

BRIEF SUMMARY OF THE INVENTION

The present invention provides a thin film transistor ("TFT") formed on a flexible substrate, the TFT having uniform characteristics, for example, uniform leakage current regardless of where the TFT is formed.

The present invention also provides a method of manufacturing the TFT.

According to exemplary embodiments of the present invention, a TFT includes a poly silicon layer formed on a flexible substrate and including a source region, a drain region, and a channel region, and a gate stack formed on the channel region of the poly silicon layer, wherein the gate stack includes first and second gate stacks, and a region of the poly silicon layer between the first and second gate stacks is an off-set region or a lightly doped drain ("LDD") region.

The first and second gate stacks may be separated by a distance of about 1 μm to about 5 μm.

The off-set region may be injected by a conductive dopant having a lower concentration than a concentration of the source and drain regions.

The first and second gate stacks may include a gate insulating film and a gate electrode sequentially stacked, and the gate insulating film may be commonly used.

The channel region may include a first channel region disposed under the first gate stack and a second channel region disposed under the second gate stack. The first channel region may be separated from the second channel region by the off-set region. The first channel region may be disposed between the source region and the off-set region, and the second channel region may be disposed between the drain region and the off-set region.

The poly silicon layer may be exposed between the first and second gate stacks.

According to other exemplary embodiments of the present invention, a method of manufacturing a TFT includes forming a poly silicon layer on a flexible substrate, forming a gate insulating film on the poly silicon layer, forming a gate electrode on a region of the gate insulating film, injecting a conductive dopant into the poly silicon layer around the gate electrode, forming a gate stack including the gate insulating film and the gate electrode by removing the gate insulating film around the gate electrode, and dividing the gate stack into a first gate stack and a second gate stack by removing a portion of the gate stack.

The poly silicon layer may be annealed prior to dividing the gate stack into the first and second gate stacks or after the gate stack is divided into the first and second gate stacks. The annealing may be performed using a furnace or a laser.

After the conductive dopant is injected, the poly silicon layer may be annealed prior to removing the gate insulating film. The annealing at this time may be performed using a furnace.

The first and second gate stacks may be separated by a distance of about 1 μm to about 5 μm.

The forming of a poly silicon layer on a flexible substrate may further include forming an amorphous silicon ("a-Si") layer on the flexible substrate and annealing the amorphous silicon layer. The annealing at this time may be performed using a furnace or a laser.

The method may further include forming an interlayer insulating layer covering the first and second gate stacks on the poly silicon layer, forming contact holes in the interlayer insulating layer that expose regions of the poly silicon layer to which the conductive dopant is injected, and forming electrodes filling the contact holes on the interlayer insulating layer.

Dividing the gate stack into a first gate stack and a second gate stack may include removing a portion of the gate stack until the poly silicon layer is exposed.

According to still other exemplary embodiments of the present invention, a method of improving uniformity of off-set regions of TFTs formed on a flexible substrate includes forming a poly silicon layer on a flexible substrate, the poly-silicon layer including a source region, a drain region, and a channel region for each TFT, forming a gate stack on each channel region of the poly silicon layer, and dividing each gate stack into first and second gate stacks, wherein a region of the poly silicon layer between each first and second gate stacks is an off-set region.

The use of the present invention allows each of the TFTs to have an identical off-set region or an LDD region regardless of the location of the TFTs even if there is a mis-alignment between TFTs. Therefore, both a transistor that is formed on a mask aligning reference position and a transistor that is formed on a location separated from the mask aligning reference position can have identical device characteristics, for example, leakage current.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
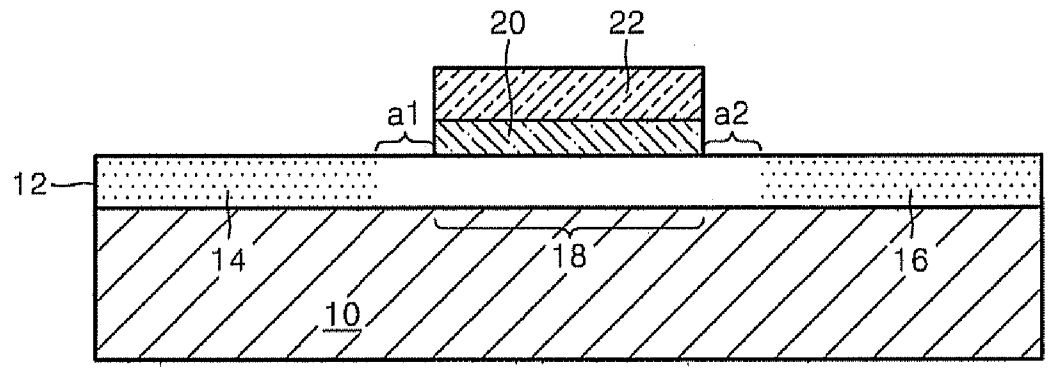
FIG. 1 is a cross-sectional view illustrating a conventional thin film transistor ("TFT") of the prior art located on a mask aligning reference position of a flexible substrate.
Figure 2:
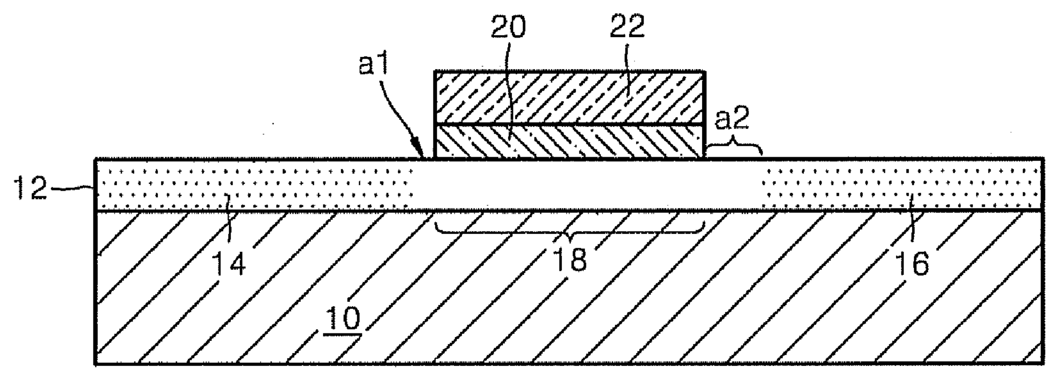
FIG. 2 is a cross-sectional view illustrating a conventional TFT of the prior art formed on a location separated from a mask aligning reference position of the same flexible substrate on which the TFT of FIG. 1 is formed.

The invention will now be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present there between. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

An exemplary thin film transistor ("TFT") formed on a flexible substrate and an exemplary method of manufacturing the TFT according to the present invention will now be described with reference to the accompanying drawings in which exemplary embodiments of the invention are shown. In the drawings, the thicknesses of layers and regions are exaggerated for clarity.

Hereinafter, a TFT formed on a flexible substrate according to an exemplary embodiment of the present invention will now be described.

Figure 3:
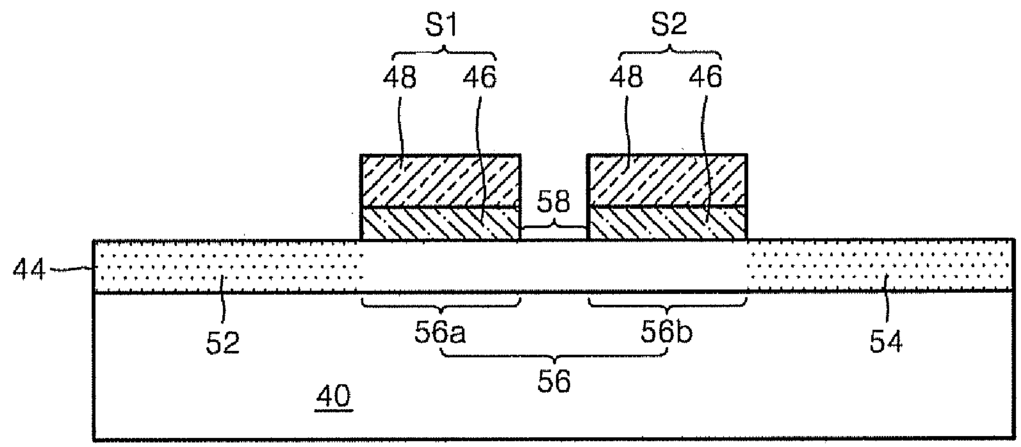
FIG. 3 is a cross-sectional view illustrating an exemplary TFT formed on an exemplary flexible substrate according to an exemplary embodiment of the present invention.

FIG. 3 is a cross-sectional view illustrating an exemplary TFT formed on an exemplary flexible substrate according to an exemplary embodiment of the present invention.

Referring to FIG. 3, a poly silicon layer 44 is formed on a flexible substrate 40. The poly silicon layer 44 includes first and second dopant regions 52 and 54 in which a conductive dopant is doped with high concentration. The first and second dopant regions 52 and 54 are separated from each other. The first and second dopant regions 52 and 54 may include a dopant, for example, an N+ type dopant. One of the first and second dopant regions 52 and 54, for example, the first dopant region 52 may be a source region, and the second dopant region 54 may be a drain region. The poly silicon layer 44 also includes a channel region 56 and an off-set region 58. The off-set region 58 is located between the first and second dopant regions 52 and 54, but is separated from the first and second dopant regions 52 and 54 by the channel region 56. The off-set region 58 is not doped with a conductive dopant, and may alternatively be doped with a low concentration if necessary. A first channel region 56*a* of the channel region 56 is located between the first dopant region 52 and the off-set region 58, and a second channel region 56*b* of the channel region 56 is located between the off-set region 58 and the second dopant region 54. A first gate stack S1 is formed on the first channel region 56*a* of the poly silicon layer 44, and a second gate stack S2 is formed on the second channel region 56*b* of the poly silicon layer 44. The first and second gate stacks S1 and S2 are separated by, for example, about 1-5 μm, or more particularly about 2-3 μm, from each other. The off-set region 58 may likewise be about 1-5 μm in width. Both the first and second gate stacks S1 and S2 are formed by sequentially stacking a gate insulating film 46 and a gate electrode 48. The gate insulating film 46 may be, for example, a silicon dioxide $SiO_2$ film, and the gate electrode 48 may be an aluminum neodymium AINd electrode. While particular materials are described, it should be understood that the exemplary TFT may include alternative materials. Next, an exemplary method of manufacturing the exemplary TFT will now be described.

FIGS. 4 through 10 are cross-sectional views illustrating an exemplary method of manufacturing an exemplary TFT formed on an exemplary flexible substrate according to the present invention.

Figure 4:
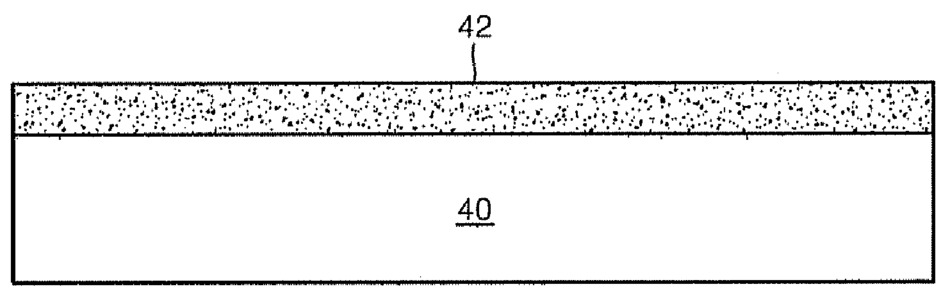
FIGS. 4 through 10 are cross-sectional views illustrating an exemplary method of manufacturing an exemplary TFT formed on an exemplary flexible substrate according to the present invention.
Figure 5:
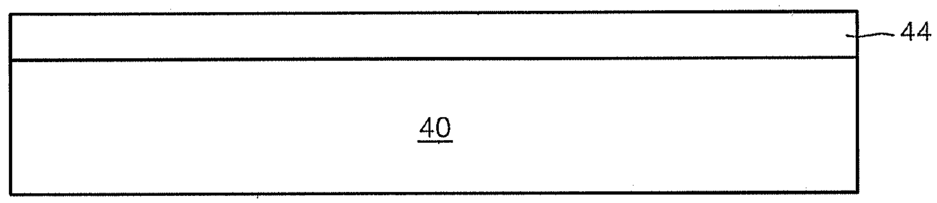

Referring to FIG. 4, an amorphous silicon ("a-Si") layer 42 is formed on a substrate 40. The substrate 40 may be a flexible substrate, for example, a glass substrate. In alternative embodiments, a plastic substrate may be used for the substrate 40. The amorphous silicon layer 42 can be grown by, for example, an epitaxy growing method. After the amorphous silicon layer 42 is grown, the substrate 40 is annealed under a predetermined condition. Due to the annealing, the amorphous silicon layer 42 is transformed to a poly silicon layer 44 as depicted in FIG. 5. The annealing may be performed using a furnace or using a specific laser such as an excimer laser. When a furnace is used, the annealing may be performed at about 200° C. for approximately one hour. At this time, the temperature and time may be varied.

Figure 6:
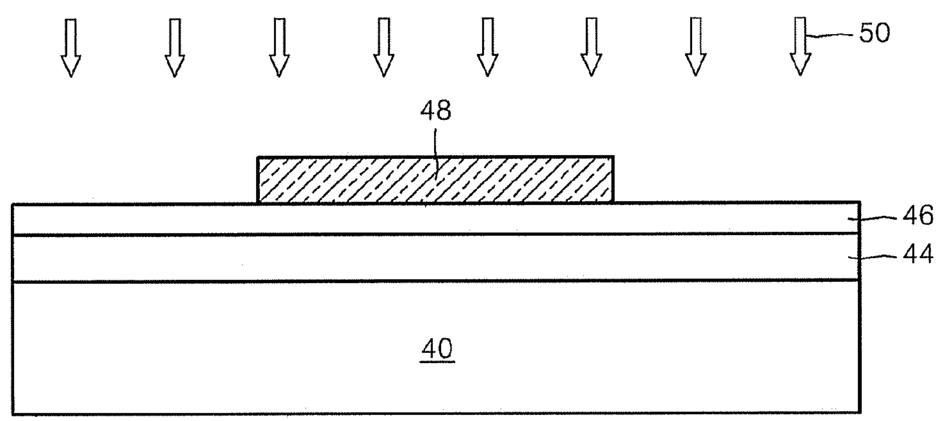
Figure 7:
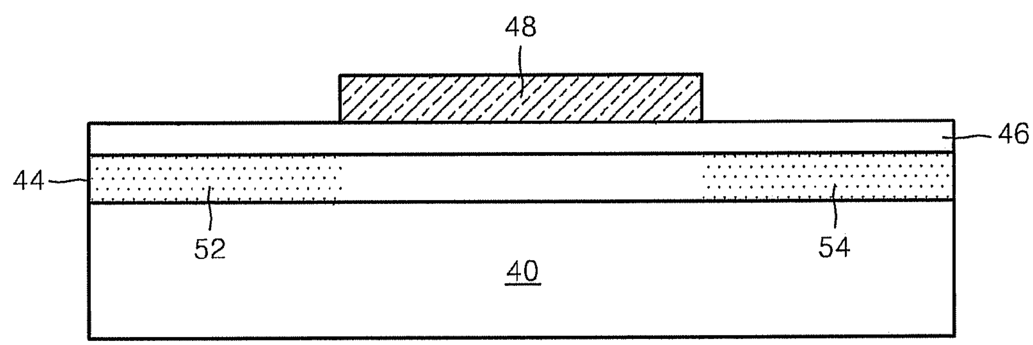
Figure 8:
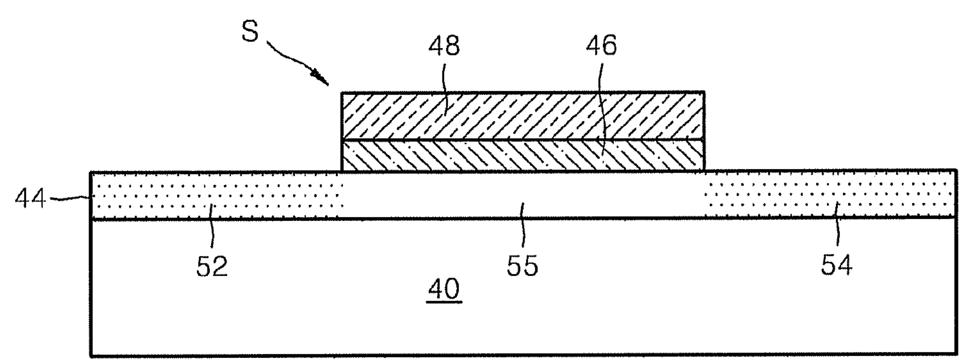

Referring to FIG. 6, a gate insulating film 46 is formed on the entire upper surface, or substantially the entire upper surface, of the poly silicon layer 44, where a lower surface of the poly silicon layer 44 faces the substrate 40. The gate insulating film 46 may be, for example, but not limited to, a silicon dioxide $SiO_2$ film. A gate electrode 48 is formed on a predetermined region of an upper surface of the gate insulating film 46, where a lower surface of the gate insulating film 46 faces the upper surface of the poly silicon layer 44. The gate electrode 48 may be formed of, for example, but not limited to, an aluminum neodymium AlNd electrode etc. A conductive dopant 50 is injected on an upper surface of the resultant product on which the gate electrode 48 is formed. At this time, the ion injection energy may have an intensity so that the conductive dopant 50 can penetrate the gate insulating film 46 but cannot penetrate the gate electrode 48 and the portion of the gate insulating film 46 underlying the gate electrode 48. The conductive dopant 50 may be, for example, an N+ type dopant. The conductive dopant 50 is injected to form a high concentration dopant region on a region of the poly silicon layer 44 that is not covered by the gate electrode 48. First and second dopant regions 52 and 54 are formed, as depicted in FIG. 7, due to the injection of the conductive dopant 50 shown in FIG. 6. The conductive dopant 50 is not injected to a portion of the poly silicon layer 44 that is covered by the gate electrode 48. Accordingly, the first and second dopant regions 52 and 54 are separated from each other by as much as the width of the gate electrode 48. Next, exposed portions of the gate insulating film 46, that is, those portions not covered by the gate electrode 48, are etched using the gate electrode 48 as a mask. As a result, as depicted in FIG. 8, the first and second dopant regions 52 and 54 are exposed, and a gate stack S, that includes the gate insulating film 46 and the gate electrode 48 having the same width as each other, is formed on the substrate 40 between the first and second dopant regions 52 and 54. In this structure, a region 55 of the poly silicon layer 44 below the gate stack S is a channel of the gate stack S, which also may have substantially the same width as the gate stack S. After the exposed portion of the gate insulating film 46 is etched, the poly silicon layer 44 of the resultant product is annealed using a furnace or a laser, for example, an excimer laser. Due to the annealing, the dopants injected into the first and second dopant regions 52 and 54 are uniformly distributed in the entire first and second dopant regions 52 and 54.

Figure 9:
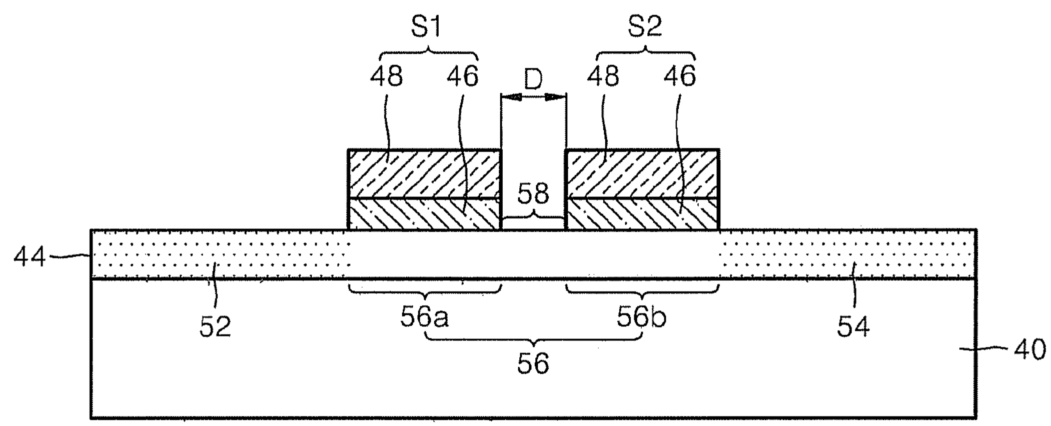
Figure 10:
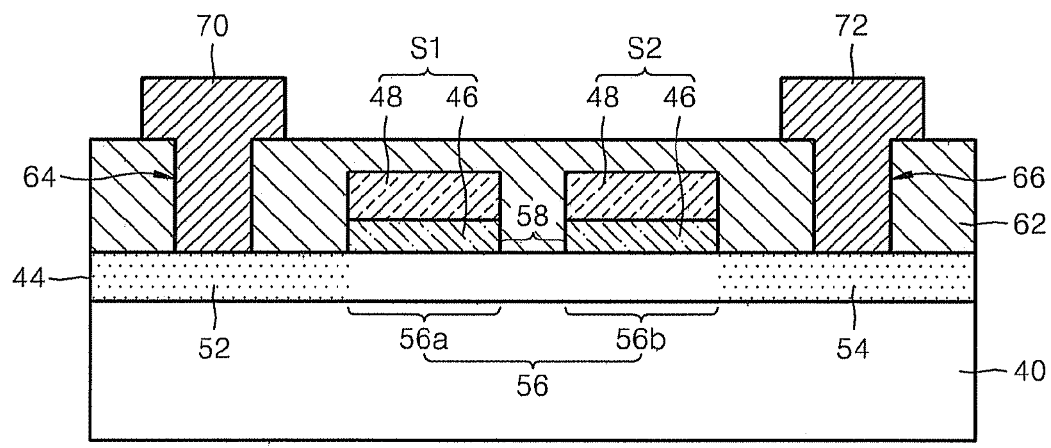

Next, as depicted in FIG. 9, the gate stack S is divided into first and second gate stacks S1 and S2. At this time, the first and second gate stacks S1 and S2 are separated by a selected distance D, for example, about 1-5 μm. The division of the gate stack S into the first and second gate stacks S1 and S2 may be performed using a photolithography method. More specifically, in the photolithography method, two masks (not shown) that cover the poly silicon layer 44 and define the first and second gate stacks S1 and S2 are formed on the gate stack S with the same distance as the distance D between the first and second gate stacks S1 and S2. Afterwards, the gate stack S is etched using the two masks formed as described above. The etching is continued until the poly silicon layer 44 is exposed between the first and second gate stacks S1 and S2. Afterwards, the two masks are removed. The configuration of the first and second gate stacks S1 and S2 is identical since the first and second gate stacks S1 and S2 are formed from the same gate stack S. A region 58 of the poly silicon layer 44 is exposed through a gap between the first and second gate stacks S1 and S2 as the result of the formation of the first and second gate stacks S1 and S2. The region 58 of the poly silicon layer 44 exposed through the gap between the first and second gate stacks S1 and S2 is a region that is not doped with the conductive dopant 50, that is, an off-set region, unlike the first and second dopant regions 52 and 54. This is due to the covering of the region 58 by the electrode 48 during the injection of the conductive dopant 50 shown in FIG. 6. Hereinafter, the region 58 of the poly silicon layer 44 is called as an off-set region. Due to the division of the gate stack S into the first and second gate stacks S1 and S2, the region 55 of the poly silicon layer 44 below the gate stack S depicted in FIG. 8 is divided into a channel region 56 and the off-set region 58, as shown in FIG. 9. The channel region 56 includes a first channel region 56*a* used for a channel of the first gate stack S1 and a second channel region 56*b* used for a channel of the second gate stack S2. The first channel region 56*a* and the second channel region 56*b* are separated from each other by the off-set region 58. After a basic structure of a TFT is formed, as depicted in FIG. 9, an interlayer insulating layer 62 covering the first and second gate stacks S1 and S2 is formed on the poly silicon layer 44 as shown in FIG. 10. A first contact hole 64 that exposes the first dopant region 52 is formed in the interlayer insulating layer 62, and at the same time, a second contact hole 66 that exposes the second dopant region 54 is formed in the interlayer insulating layer 62. A first electrode 70 and a second electrode 72 are respectively formed on the interlayer insulating layer 62 by filling a metal material in the first contact hole 64 and the second contact hole 66, such that the first electrode 70 contacts the first dopant region 52 of the poly silicon layer 44 and the second electrode 72 contacts the second dopant region 54 of the poly silicon layer 44. The first electrode 70 may be a source electrode, and the second electrode 72 may be a drain electrode.

In an alternative embodiment, in the process of dividing the gate stack S of FIG. 8, only the gate electrode 48 may be divided without dividing the gate insulating film 46. In this case, the first and second gate stacks S1 and S2 commonly use the gate insulating film 46.

While the annealing process of the poly silicon layer 44 has been described as performed after the gate insulating film 46 is etched to form the gate stack S as shown in FIG. 8, alternatively, the annealing for activating the ion injected dopant may be performed after the first and second gate stacks S1 and S2 are formed as shown in FIG. 9. That is, after etching the exposed portion of the gate insulating film 46, the first and second gate stacks S1 and S2 are formed by dividing the gate stack S, and then, the annealing may be performed. Also, when the annealing is performed using a furnace, the annealing may be performed prior to etching the exposed portion of the gate insulating film 46. Also, the conductive dopant 50 may be injected to the off-set region 58 with a concentration lower than the concentration of the first and second dopant regions 52 and 54.

As described above, in the present invention, an off-set region is formed between dual gates in a process of forming the dual gates by dividing a single gate after the single gate is formed. Accordingly, even if there is a mis-alignment in a process of forming the single gate, the off-set region of each device can be uniformly formed regardless of the location of the device. Therefore, the reduction of characteristics, for example, leakage current, of the device according to the location difference of an off-set region can be prevented.

While the present invention has been particularly shown and described with reference to exemplary embodiments thereof, it should not be construed as being limited to the embodiments set forth herein. Those skilled in this art, for example, can use a different flexible substrate instead of the glass substrate, and can use a single crystal silicon layer instead of the poly silicon layer. Also, the gate insulating film and the gate electrode can be formed of other materials instead of $SiO_2$ and AlNd. Also, the scope of the present invention can be applied to a bottom type TFT. Therefore, the scope of the invention is defined not by the detailed description of the invention but by the appended claims.

What is claimed is:

1. A thin film transistor comprising:

a poly silicon layer formed on a flexible substrate and comprising a source region, a drain region, and a channel region;

a gate stack formed on the channel region of the poly silicon layer; and an insulating layer covering the gate stack, wherein the gate stack comprises first and second gate stacks, and a region of the poly silicon layer between the first and second gate stacks is not covered by a gate electrode and is an off-set region, and wherein the off-set region is not doped with a conductive dopant.

2. The thin film transistor of claim 1, wherein the first and second gate stacks are separated by a distance of about 1 μm to about 5 μm.

3. The thin film transistor of claim 1, wherein the off-set region is injected by a conductive dopant having a lower concentration than a concentration of the source and drain regions.

4. The thin film transistor of claim 1, wherein the first and second gate stacks comprise a gate insulating film and a gate electrode sequentially stacked.

5. The thin film transistor of claim 4, wherein a gate electrode of the first gate stack is separated from a gate electrode of the second gate stack, and the gate insulating film is commonly used in the first and second gate stacks.

6. The thin film transistor of claim 1, wherein the channel region includes a first channel region disposed under the first gate stack and a second channel region disposed under the second gate stack, the first channel region separated from the second channel region by the off-set region, the first channel region disposed between the source region and the off-set region, and the second channel region disposed between the drain region and the off-set region.

7. The thin film transistor of claim 1, wherein the poly silicon layer is exposed between the first and second gate stacks.

8. A method of improving uniformity of off-set regions of thin film transistors formed on a flexible substrate, the method comprising:

forming a poly silicon layer on a flexible substrate, the polysilicon layer including a source region, a drain region, and a channel region for each thin film transistor;

forming a gate stack on each channel region of the poly silicon layer; and, dividing each gate stack into first and second gate stacks, wherein a region of the poly silicon layer between each first and second gate stacks is an off-set region, and wherein the off-set region is not doped with a conductive dopant.

* * * * *